United States Patent
Lo et al.

(10) Patent No.: US 9,082,582 B2
(45) Date of Patent: Jul. 14, 2015

(54) CARRIER ASSEMBLY OF MICROSCOPE ELEMENT AND OPERATION METHOD THEREOF

(75) Inventors: Shen-Chuan Lo, Zhubei (TW); Ming-Wei Lai, Taichung (TW); Mei-Lun Wu, Hsinchu (TW); Li-Jiaun Lin, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 10 days.

(21) Appl. No.: 13/224,142

(22) Filed: Sep. 1, 2011

(65) Prior Publication Data

US 2012/0162756 A1    Jun. 28, 2012

(30) Foreign Application Priority Data

Dec. 27, 2010  (TW) ................................ 99146169 A

(51) Int. Cl.
*G02B 21/26*  (2006.01)
*H01J 37/20*  (2006.01)

(52) U.S. Cl.
CPC .............. *H01J 37/20* (2013.01); *G02B 21/26* (2013.01); *H01J 2237/20214* (2013.01)

(58) Field of Classification Search
CPC .... G02B 21/0016; G02B 21/24; G02B 21/26; G02B 21/32; G02B 21/36; G02B 21/362; G02B 21/365
USPC .......................................... 359/368, 391–394
See application file for complete search history.

(56) References Cited

U.S. PATENT DOCUMENTS

| | | | |
|---|---|---|---|
| 5,192,867 | A | 3/1993 | Osakabe et al. |
| 5,223,109 | A | 6/1993 | Itoh et al. |
| 6,576,910 | B2 | 6/2003 | Hashikawa et al. |
| 2002/0005492 | A1 | 1/2002 | Hashikawa et al. |
| 2008/0099695 | A1* | 5/2008 | Sugizaki ................... 250/492.1 |
| 2011/0115637 | A1* | 5/2011 | Kikuchi et al. ............... 340/600 |
| 2012/0119109 | A1* | 5/2012 | Kim et al. ................ 250/442.11 |

FOREIGN PATENT DOCUMENTS

| | | |
|---|---|---|
| CN | 2828847 | 10/2006 |
| CN | 101553749 | 10/2009 |

(Continued)

OTHER PUBLICATIONS

Luck, et al. "Three-Dimensional Analysis of Intermediate Filament Networks Using SEM Tomography", Journal of Microscopy, (2010), pp. 1-16, vol. 239, Pt. 1.
Miller, et al. "Strategies for Fabricating Atom Probe Specimens With a Dual Beam FIB", Ultramicroscopy (2005), pp. 287-298, vol. 102.

(Continued)

*Primary Examiner* — Stephone B Allen
*Assistant Examiner* — James McGee
(74) *Attorney, Agent, or Firm* — Muncy, Geissler, Olds & Lowe, P.C.

(57) ABSTRACT

A carrier assembly and an operation method thereof are provided. The carrier assembly comprises a base, a first gear element, a second gear element, an object-carrier and a fixing part. The first gear element is rotatably disposed on the base, and the second gear element is rotatably disposed on the base and meshed with the first gear element. The object-carrier is used for carrying an object. The fixing part connects the base to a carrier platform. Wherein, an included angle is contained between the rotating axis of the first gear element and the rotating axis of the second gear element.

9 Claims, 5 Drawing Sheets

(56) References Cited

FOREIGN PATENT DOCUMENTS

| | | |
|---|---|---|
| CN | 101706610 | 5/2010 |
| WO | WO 2010010771 A1 * | 1/2010 |

OTHER PUBLICATIONS

Perez-Willard, et al."Focused Ion Beam Preparation of Atom Probe Specimens Containing a Single Crystallographically Well-Defined Grain Boundary", Micron (2008), pp. 45-52, vol. 39.

* cited by examiner

CARRIER ASSEMBLY OF MICROSCOPE ELEMENT AND OPERATION METHOD THEREOF

This application claims the benefit of Taiwan application Serial No. 99146169, filed Dec. 27, 2010, the disclosure of which is incorporated by reference herein in its entirety.

BACKGROUND

1. Technical Field

The disclosure relates in general to a carrier assembly of a microscope element and an operation method thereof, and more particularly to a carrier assembly of a microscope element used in a microscope element and an operation method thereof.

2. Description of the Related Art

Referring to FIG. 1 (Prior Art), a carrier platform of a conventional scanning electron microscope (SEM) or focused ion beam (FIB) microscope system is shown. Apart from the movement in the x, y, z axis directions, the carrier platform 12 can rotate around the z axis and the x axis. However, the ordinary carrier platform 12 is usually subjected to an angle restriction with range less than 100 degrees around the x axis, therefore the to-be-detected object 14 disposed thereon can only be radiated by the incident particle beam 16 within a limited angle range, which is restrictive to the data collection of SEM tomography or the FIB-based full-angle lateral object processing.

SUMMARY

The disclosure is directed to a carrier assembly and an operation method thereof. The carrier assembly drives an object to rotate, so as to increase the performance in tomographic 3D analysis or object processing of a microscope system.

According to one embodiment, a carrier assembly of a microscope element is provided. The carrier assembly comprises a base, a first gear element, a second gear element, an object-carrier, a fixing part and carrier platform. The first gear element is rotatably disposed on the base. The second gear element is rotatably disposed on the base and meshed with the first gear element. The object-carrier is disposed on the second gear element used for carrying an object. The fixing part connects the base to a carrier platform. An included angle is contained between the rotating axis of the first gear element and the rotating axis of the second gear element.

According to another embodiment, a carrier operation method is provided. The carrier assembly is disposed on a microscope element. The carrier comprises a base, a first gear element, a second gear element, an object-carrier and a fixing part. The first gear element is rotatably disposed on the base. The second gear element is rotatably disposed on the base and meshed with the first gear element. The object-carrier is disposed on the second gear element for carrying an object. The fixing part connects the base to a carrier platform. An included angle is contained between the rotating axis of the first gear element and the rotating axis of the second gear element. The operation method comprises the following steps. A first gear element is driven to rotate. The first gear element drives the second gear element to rotate, wherein the object-carrier drives the object to rotate along with the rotation of the second gear element, so that the object radiated by a particle beam of the microscope element at different angles.

Figure 1:
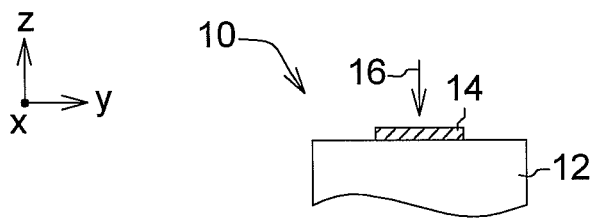
FIG. 1 shows a carrier platform of a conventional microscope element.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 2:
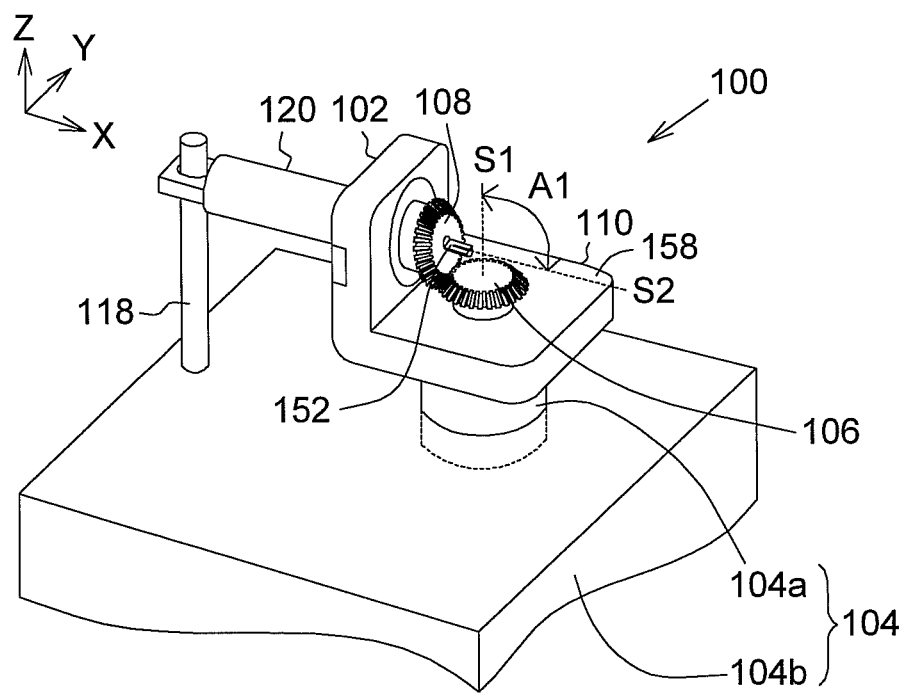
FIG. 2 shows a microscope element according to an embodiment of the disclosure.

Referring to FIG. 2, a microscope element according to an embodiment of the disclosure is shown. A carrier 102 comprises a base 110, a first gear element 106, a second gear element 108, an object-carrier 152 and a fixing part 118. The carrier 102 is disposed on a carrier platform 104. A carrier assembly comprises the carrier 102 and the carrier platform 104. The carrier platform 104 comprises a rotatable portion 104a and a non-rotatable portion 104b, wherein the rotatable portion 104a can rotate along a vertical axis and the non-rotatable portion 104b cannot rotate along a vertical axis. The carrier assembly 102 of the present embodiment of the disclosure is not limited to the structure illustrated in FIG. 2. In other embodiments, the shape and structure of the carrier assembly 102 can be different from that illustrated in FIG. 2. The microscope element can be realized by a scanning electron microscope, a focused ion beam microscope element or a microscope element of other types.

The first gear element 106 is rotatably disposed on the base 110, and connected to the rotatable portion 104a of the carrier platform 104. The rotatable portion 104a can drive the first gear element 106. The second gear element 108 is rotatably disposed on the base 110 and meshed with the first gear element 106. In the present embodiment of the disclosure, the second gear element 108 is directly meshed with the first gear element 106. Wherein, an included angle A1 is contained between the rotating axis S1 of the first gear element 106 and the rotating axis S2 of the second gear element 108.

The object-carrier 152 is disposed on the second gear element 108. The object-carrier 152 can have a to-be-detected or to-be-processed object 154 (illustrated in FIG. 6) disposed thereon. When the first gear element 106 is driven by the rotatable portion 104a of the carrier platform 104 to rotate, the second gear element 108 is driven by the first gear element 106 to rotate accordingly, and the object-carrier 152 disposed on the second gear element 108 and the object 154 located in the object-carrier 152 also rotate along with the rotation of the second gear element 108. Thus, the object 154 can be rotated around the rotating axis S2 up to 360 degrees to be radiated by an incident particle beam of the microscope element (such as an electron beam or an ion beam) to achieve full angle tomographic image capturing or processing.

The fixing part 118 and the first gear element 106 can be fixed on the carrier platform 104 directly or via a detachable structure, so that the carrier assembly 102 of the present embodiment of the disclosure can be easily disposed on the carrier platform of a microscope element of any kind, and has the advantages of easy assembly and disassembly. The above structure is such as a locking part or an engaging part. For example, a locking element (not illustrated) or an engaging part (not illustrated) can be used for fixing the fixing part 118 on the non-rotatable portion 104b of the carrier platform 104 by way of screwing or engaging. Likewise, a locking element or an engaging part can be used for fixing the first gear element 106 on the rotatable portion 104a of the carrier platform 104 by way of screwing or engaging.

In addition, the fixing part 118 connects the non-rotatable portion 104b disposed on the carrier platform 104 to the base 110, so that when the first gear element 106 drives the second gear element 108 to rotate, the base 110 does not rotate accordingly. For example, the fixing part 118 and the first transition part 120 are engaged so that the base 110 does not rotate accordingly.

Figure 3:
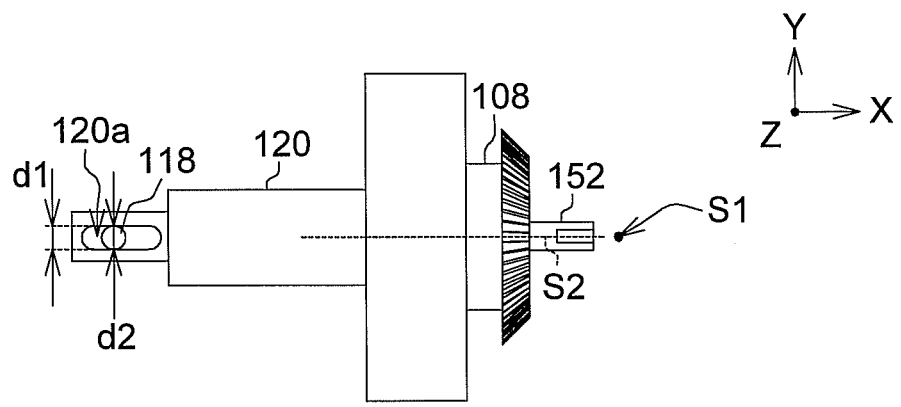
FIG. 3 shows a first transition part and a fixing part of FIG. 2 being engaged.

Referring to FIG. 3, a first transition part and a fixing part of FIG. 2 being engaged is shown. The base may have an opening hole for engaging the fixing part therein. For example, the base 110 comprises a base body 158 (illustrated in FIG. 2) and a first transition part 120, wherein the first transition part 120 is fixed on the base body 158 of the base 110 and has an opening hole 120a. The fixing part 118 is fixed on the carrier platform 104 and is engaged in the opening hole 120a of the first transition part 120. The opening hole 120a can be a strip hole or a round hole. In the present embodiment of the disclosure, the opening hole 120a is exemplified by a strip hole. The extending direction of the opening hole 120a (the long axis direction) is substantially parallel to the rotating axis S2 of the second gear element 108. The inner diameter d1 of the opening hole 120a along a direction is substantially equal to or smaller than the outer diameter d2 of a junction of the fixing part 118 jointing to the opening hole 120a. The direction here refers to the impact direction (force is applied along the impact direction) of an inner wall of the opening hole 120a when the first gear element 106 rotates.

Since the opening hole 120a also tends to rotate around the rotating axis S1 (such as along the tangent direction Y) when the first gear element 106 rotates around the rotating axis S1, the opening hole 120a is resisted by the fixing part 118 along the Y-axis direction and thus receives a force. Since the inner diameter d1 of the opening hole 120a along the Y-axis direction is substantially equal to the outer diameter d2 of a junction of the fixing part 118 jointing to the opening hole 120a, the movement of the opening hole 120a of the first transition part 120 along the Y-axis direction is thus restricted. When the first gear element 106 rotates, the first transition part 120 is restricted by the fixing part 118, so the base 110 is also restricted and does not move. Thus, the first gear element 106 can rotate around the rotating axis S1 and makes the second gear element 108 also rotate around the rotating axis S2.

In the present embodiment of the disclosure, the X-Y-Z coordinate system is for elaborating the viewing angle direction and the rotation direction of the gear, not for limiting the coordinate system of the carrier platform 104 or that of the microscope element. For example, in the present embodiment of the disclosure, the X axis denotes the rotating axis S2 of the second gear element 108, and the Z axis denotes the rotating axis S1 of the first gear element 106. However, in other embodiments, the X-Y-Z axes can be defined in different ways.

In the present embodiment of the disclosure, the first transition part 120 has an opening hole 120a, but such exemplification is not for limiting the disclosure. In other implementations, the first transition part can omit the opening hole, and the fixing part can have an opening hole for engaging the base therein.

Figure 4:
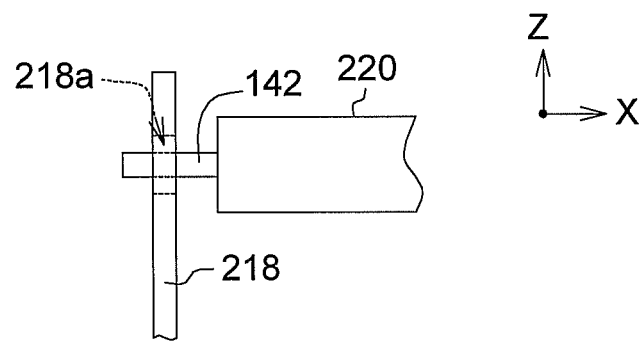
FIG. 4 shows a first transition part and a fixing part being engaged according to an implementation of the disclosure.
Figure 5:
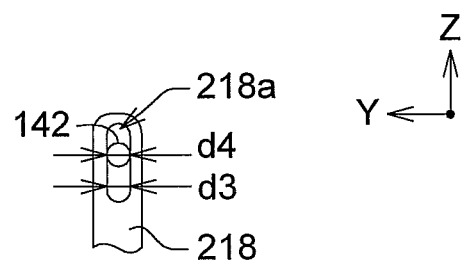
FIG. 5 shows a side view along a +X-axis direction of FIG. 4.

Referring to FIG. 4 and FIG. 5. FIG. 4 shows a first transition part and a fixing part being engaged according to an implementation the disclosure. FIG. 5 shows a side view along a +X-axis direction of FIG. 4. The fixing part 218 has an opening hole 218a whose extending direction (the long axis direction) is substantially parallel to the rotating axis S1, wherein the opening hole 218a is such as a strip hole. The inner diameter d3 of the opening hole 218a along the Y-axis direction is substantially equal to the outer diameter d4 of a junction of the first transition part 220 jointing to the opening hole 218. In the present embodiment of the disclosure, the first transition part 220 has an insertion portion 142 inserted into the opening hole 218a. The inner diameter d3 of the opening hole 218a is substantially equal to the outer diameter d4 of a junction of the insertion portion 142 jointing to the opening hole 218a.

In the present embodiment of the disclosure, the fixing part 118 is realized by a long rod, but such exemplification is not for limiting the disclosure. In other implementations, the fixing part 118 can have other shapes. Furthermore, any first transition part 120 capable of fixing the base 110 is within the scope of the fixing part 118 of the embodiment of the disclosure.

The structures of the base 110, the first gear element 106 and the second gear element 108 are further elaborated below.

Figure 6:
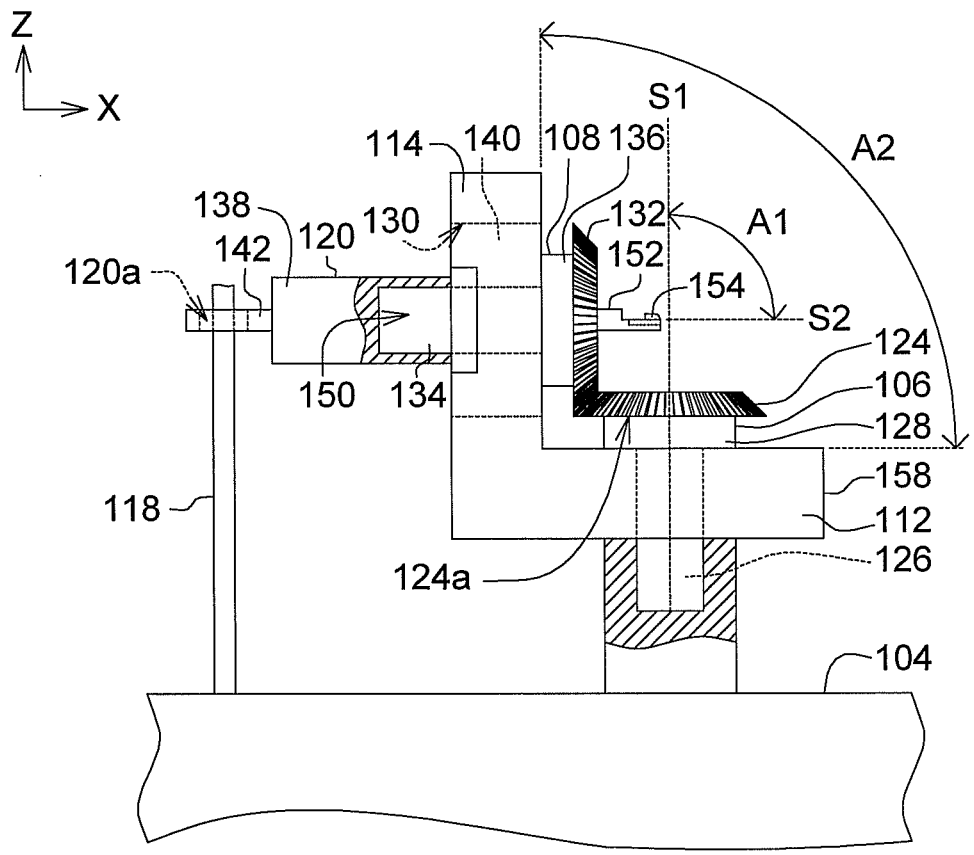
FIG. 6 shows a front view of FIG. 2.

Referring to FIG. 6, a front view of FIG. 2 is shown. The base body 158 comprises a first sub-base 112 and a second sub-base 114. The first sub-base 112 is fixed on the second sub-base 114, and an included angle A2 is contained between the first sub-base 112 and the second sub-base 114. In an implementation, the included angle A2 is about 90 degrees, that is, the first sub-base 112 and the second sub-base 114 form an L-shaped base. However, in other implementation, the included angle A2 can be different value.

The first gear element 106 is such as an assembly or an integrally formed element. The first gear element 106 comprises a first gear 124, a second rotation rod 126 and a third rotation rod 128. The outer diameter of the second rotation rod 126 is smaller than the outer diameter of the third rotation rod 128, so that the second rotation rod 126 and the third rotation rod 128 together form a segment difference rod. The second rotation rod 126 can be directly fixed on the carrier platform 104, but such exemplification is not for limiting the disclosure.

In other embodiments, the second rotation rod can be fixed on a carrier platform via a transition structure of various types.

Figure 7:
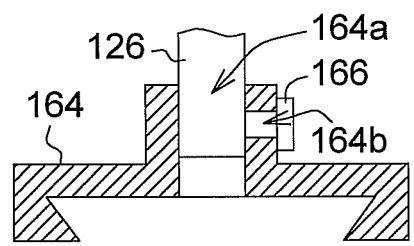
FIG. 7 shows a cross-sectional view of a second transition part of a carrier assembly according to other embodiments of the disclosure.

Referring to FIG. 7, a cross-sectional view of a second transition part of a carrier assembly according to other embodiments of the disclosure is shown. The second transition part 164 has an opening hole 164a and a screw hole 164b. The second transition part 164 is for connecting the second rotation rod 126 to the carrier platform 104. For example, the second rotation rod 126 can pass through the opening hole 164a, and the locking element 166 can pass through the screw hole 164b to fix the second rotation rod 126 on the second transition part 164. Besides, the second transition part 164 and a carrier platform can be combined in various manners according to the design of the carrier platform structure, so that the first gear element 106 of the carrier assembly 102 can be disposed on various types of the carrier platform via second transition part 164. In the present example, the bottom of the second transition part 164 can be realized by a recess for coupling the carrier platform 104.

As illustrated in FIG. 6, the third rotation rod 128 is disposed on the base 110 and connects the first gear 124 to the second rotation rod 126. The design of disposing the third rotation rod 128 on the base 110 for raising the first gear 124, but such exemplification is not for limiting the disclosure. In other implementations, the first gear element 106 can omit the third rotation rod 128, and the second rotation rod 126 connects the first gear 124 to the carrier platform 104 of a microscope element.

The second gear element 108 is such as an assembly or an integrally formed element. The second gear element 108 comprises a second gear 132, a first rotation rod 134 and a connecting part 136. The second gear element 108 can be rotatably connected to the first transition part 120 by the first rotation rod 134. The second gear 132 is such as a bevel gear. The connecting part 136 connects the second gear 132 to the first rotation rod 134. An included angle A1 about 90 degrees is contained between the rotating axis S1 of the first gear element 106 and the rotating axis S2 of the second gear element 108. In other implementations, the first gear element 106 and the second gear element 108 can also be realized by a gear of other types. Under such circumstance, the included angle between the rotating axis S1 of the first gear element 106 and the rotating axis S2 of the second gear element 108 is not limited to 90 degrees.

Figure 8:
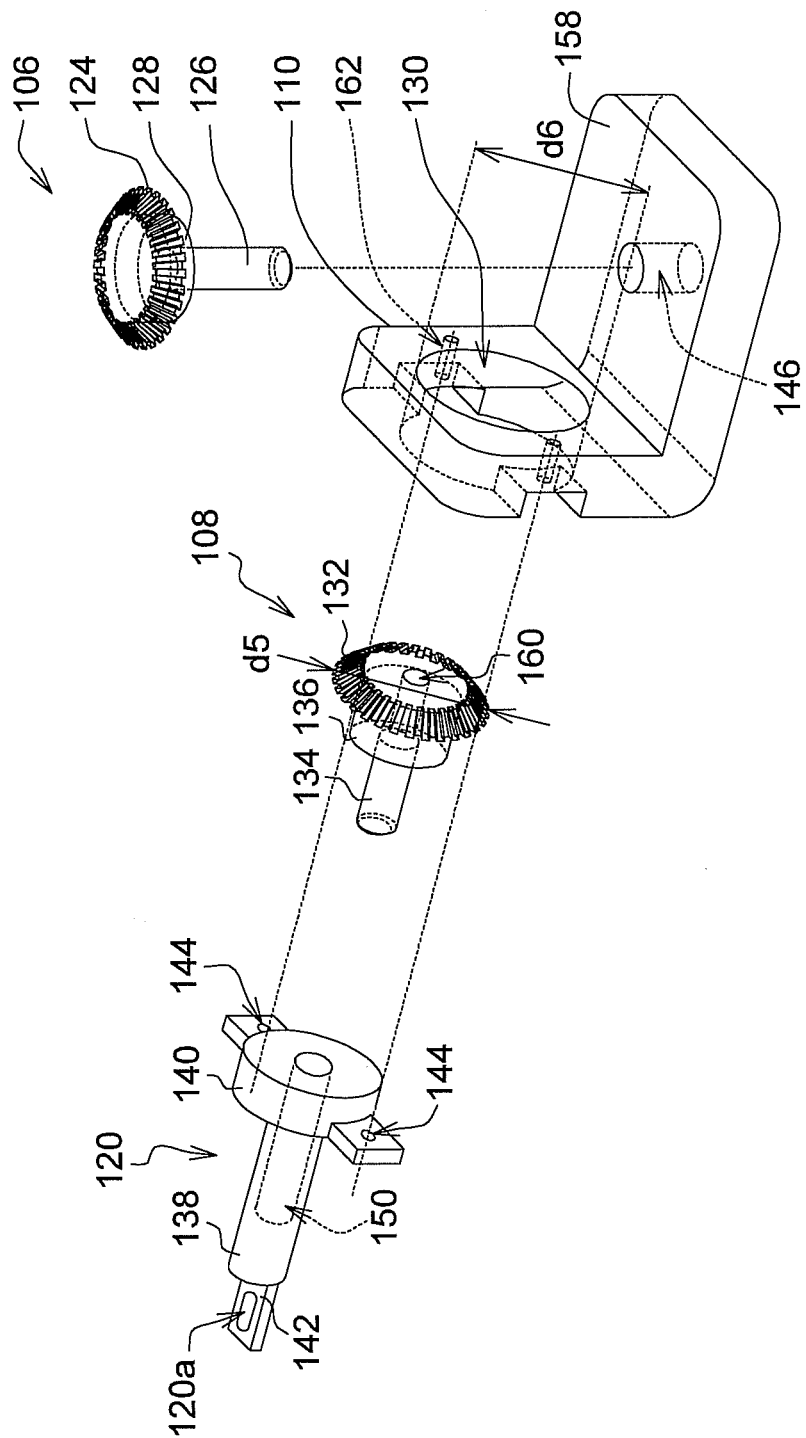
FIG. 8 shows an explosion diagram of a base, a first transition part, a first gear element and a second gear element of FIG. 6.

Referring to both FIG. 6 and FIG. 8. FIG. 8 shows an explosion diagram of a base, a first transition part, a first gear element and a second gear element of FIG. 6. The first transition part 120 comprises a first fixing rod 138 and a holder 140 and has a through hole 150. The insertion portion 142 is one terminal of the first fixing rod 138 engaged on the fixing part 118. The opening hole 120a passes through the terminal 142. The holder 140 is fixed on the first fixing rod 138. As indicated in FIG. 6, the holder 140 is located inside the base through hole 130, and the connecting part 136 of the second gear element 108 presses on the holder 140 and is stopped by the holder 140.

As indicated in FIG. 8, the maximum outer diameter d5 of the second gear 132 is smaller than the inner diameter d6 of the base through hole 130, so that the second gear element 108 can pass through the base through hole 130 in a direction towards the base body 158 of FIG. 8. The first rotation rod 134 of the second gear element is disposed in the through hole 150 of the first transition part 120. The holder 140 of the first transition part 120 is fixed on the base body 158 of the base 110. The holder 140 can pass through hole 144 to be fixed on the screw hole 162 of the base body 158 of the base 110 by a locking element (not illustrated). Besides, the base body 158 has a through hole 146. The second rotation rod 126 of the first gear element 106 can be inserted into the through hole 146 and makes the third rotation rod 128 lean against the base 110, and then the second gear element 108 passes through the base through hole 130 in a direction towards the base 110 of FIG. 8 until the second gear element 108 is meshed with the first gear element 106. Since the first transition part 120 is fixed on the base body 158 by way of screwing or other detachable method, the assembly and disassembly of the second gear element 108 is thus fast and convenient.

Moreover, the outer diameter of the first rotation rod 134 of the second gear element 108 is smaller than the inner diameter of the through hole 150, so that the first rotation rod 134 can rotate freely in the through hole 150 of the first fixing rod 138. Preferably but not limitedly, the outer diameter of the first rotation rod 134 and the inner diameter of the through hole 150 precisely match with each other. That is, the outer diameter of the first rotation rod 134 is substantially equal to or slightly smaller than the inner diameter of the through hole 150.

Figure 9:
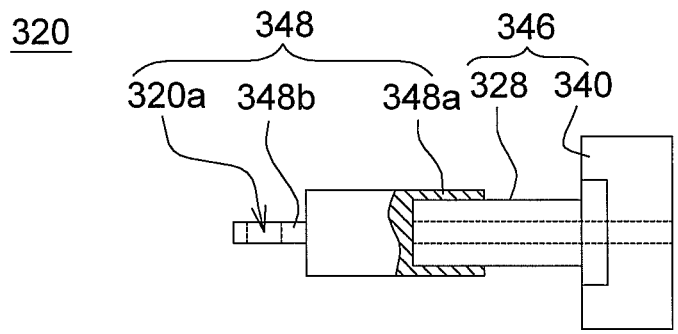
FIG. 9 shows a cross-sectional view of a first transition part according to other implementations of the disclosure.

The first transition part 120 is an integrally formed structure, that is, the first fixing rod 138 and the holder 140 are formed in the same manufacturing process. For example, the first transition part 120 is formed from a single clock of base metal by mechanical cutting. Or, the first transition part 120 is formed by casting. However, in other implementations, the first transition part can also be formed by a plurality of sub-parts. Referring to FIG. 9, a cross-sectional view of a first transition part according to other implementations of the disclosure is shown. The first transition part 320 comprises a first sub-part 346 and a second sub-part 348. The first sub-part 346 comprises a first fixing rod 328 and a holder 340. The holder 340 is fixed on the first fixing rod 328. The first fixing rod 328 is fixed on a terminal 348a of the second sub-part 348 by way of screwing, engaging or soldering. A terminal 348b of the second sub-part 348 has an opening hole 320a. Wherein, the holder 340 and the opening hole 320a are respectively similar to the holder 140 and the opening hole 120a disclosed above, and the similarities are not repeated here.

Figure 10:
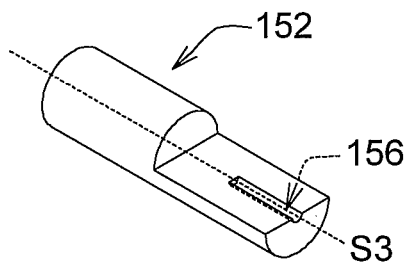
FIG. 10 shows an object-carrier of FIG. 6.

As indicated in FIG. 6 and FIG. 10. FIG. 10 shows an object-carrier of FIG. 6. The object-carrier 152 is disposed on the second gear element 108. For example, the object-carrier 152 is fixed on the second gear 132 of the second gear element 108. The object-carrier 152 has an accommodation recess 156, wherein the object-carrier 152 is fixed on the second gear 132 with the accommodation recess 156 passing through the rotating axis S2 of the second gear 132, so that when the second gear 132 rotates, the to-be-analyzed or to-be-processed object 154 located in the accommodation recess 156 will also rotate along the rotating axis S2. For example, the center axis S3 (illustrated in FIG. 10) of the object-carrier 152 passes through the accommodation recess 156, and the second gear 132 has a screw hole or a through hole 160 (illustrated in FIG. 8). When the object-carrier 152 is disposed on the screw hole or the through hole 160 of the second gear 132, the center of the screw hole or the through hole 160, the rotating axis S2 of the second gear 132 and the center axis S3 of the object-carrier 152 are overlapped. Thus, when the second gear 132 rotates, the object 154 located on the accommodation recess 156 will also rotate along the rotating axis S2.

Figure 11:
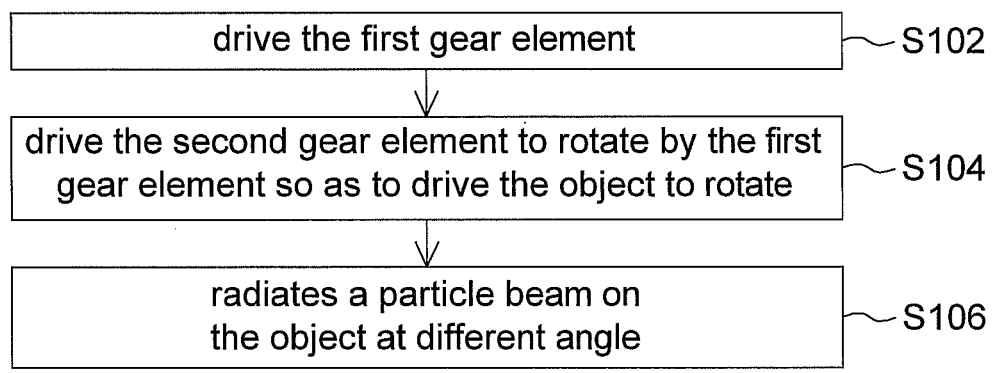
FIG. 11 shows a flowchart of an operation method of a microscope element according to an embodiment of the disclosure.

The operation method of a microscope element is disclosed below with the accompanying flowchart illustrated in FIG. 11. Referring to FIG. 11, a flowchart of an operation method of a microscope element according to an embodiment of the disclosure is shown. Steps S102~S104 refer to the operation method of the carrier assembly 102.

In step S102, the rotatable portion 104a drives the first gear element 106 to rotate.

In step S104, as the first gear element 106 drives the second gear element 108 to rotate, the object-carrier 152 fixed on the second gear 132 rotates accordingly so as to drive the object 154 to rotate around the rotating axis S2. The object 154 is radiated by a particle beam of the microscope element 100.

In step S106, the microscope element 100 radiates a particle beam (such as an electron beam or an ion beam) on the object 154. Since the object 154 can rotate around the rotating axis S2 for up to 360 degrees, the microscope element 100 can examine or process the object 154 around the rotating axis S2 up to 360 degrees.

In the present embodiment of the disclosure, after the carrier assembly 102 is disposed on the carrier platform of an ordinary carrier platform, the object 154 can be driven by a gear mechanism to rotate around the rotating axis S2 up to 360 degrees, so that the microscope element 100 can perform 3D tomographic image capturing or full-angle lateral processing on the object 154.

According to the carrier assembly and the operation method thereof disclosed in the above embodiments of the disclosure, the to-be-analyzed or to-be-processed object can rotate around the rotating axis S2 up to 360 degrees to be radiated by an incident particle beam (such as an electron beam or an ion beam) of the microscope element so as to achieve full angle tomographic image capturing or processing. In addition, the carrier assembly is portable and detachable, and is very convenient to be assembled on and disassembled from the carrier platform.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A carrier assembly applicable to be disposed on a microscope element, wherein the carrier assembly comprises:
    a base non-rotatably disposed on a carrier platform of the microscope element;
    a first gear element rotatably disposed on the base and directly or indirectly connected to a rotatable portion of the carrier platform belonging to the microscope element, wherein the carrier platform further comprises a non-rotatable portion;
    a second gear element rotatably disposed on the base and meshed with the first gear element;
    an object-carrier disposed on the second gear element for carrying an object, and
    a fixing part connecting the base to the non-rotatable portion of the carrier platform;
    wherein, an included angle is contained between a rotating axis of the first gear element and a rotating axis of the second gear element;
    wherein one of the base and the fixing part has an opening hole, and the other of the base and the fixing part is detachably inserted into the opening hole to directly engage in the opening hole for restricting movement of the opening hole along a direction perpendicular to the rotating axis of the first gear element and the rotating axis of the second gear element.

2. The carrier assembly according to claim 1, wherein both the first gear element and the second gear element are a bevel gear.

3. The carrier assembly according to claim 1, wherein the included angle is substantially equal to 90 degrees.

4. The carrier assembly according to claim 1, wherein the base comprises:
    a base body having a base through hole; and
    a first transition part fixed on the base body;
    wherein, one of the first transition part and the second gear element passes through the base through hole, and the second gear element can be movably connected to the first transition part.

5. The carrier assembly according to claim 4, wherein the first transition part comprises:
    a first fixing rod engaged on the fixing part; and
    a holder fixed on the first fixing rod and located inside the base through hole;
    the second gear element comprises:
    a second gear whose outer diameter is smaller than an inner diameter of the base through hole;
    a first rotation rod movably connected to the first transition part; and
    a connecting part for connecting the second gear to the first rotation rod and pressing the holder of the first transition part.

6. The carrier assembly according to claim 1, wherein the carrier assembly further comprises:
    a second transition part for connecting the first gear element to the rotatable portion of the carrier platform.

7. The carrier assembly according to claim 1, wherein the base has the opening hole, an inner diameter of the opening hole along a direction is substantially equal to or smaller than an outer diameter of a junction of the fixing part jointing to the opening hole; wherein the direction is an impact direction of the opening hole when the first gear element rotates.

8. The carrier assembly according to claim 1, wherein the base has a first fixing rod, the fixing part has the opening hole, an inner diameter of the opening hole along a direction is substantially equal to or smaller than an outer diameter of a junction of the first fixing rod of the base jointing to the opening hole; wherein the direction is an impact direction of the opening hole when the first gear element rotates.

9. An operation method of a carrier assembly, wherein the carrier assembly applicable to be disposed on a microscope element comprises a base, a first gear element, a second gear element, an object-carrier and a fixing part, the base is non-rotatably disposed on a carrier platform of the microscope element, the first gear element is rotatably disposed on the base and directly or indirectly connected to a rotatable portion of the carrier platform belonging to the microscope element, wherein the carrier platform further comprises a non-rotatable portion, the second gear element is rotatably disposed on the base and meshed with the first gear element, the object-carrier is disposed on the second gear element for carrying an object, the fixing part connects the base to the non-rotatable portion of the carrier platform, an included angle is contained between a rotating axis of the first gear element and a rotating axis of the second gear element, one of the base and the fixing part has an opening hole, and the other of the base and the fixing part is detachably inserted into the opening hole to directly engage in the opening hole for restricting movement of the opening hole along a direction perpendicular to the rotating axis of the first gear element and the rotating axis of the second gear element, and the operation method comprises:
    driving the first gear element to rotate by the rotatable portion of the carrier platform; and driving the second gear element to rotate by the first gear element, wherein the object-carrier drives the object to rotate along with the rotation of the second gear element, so that the object is radiated by a particle beam of the microscope element at different angles.

* * * * *